United States Patent
Lou et al.

(10) Patent No.: US 12,016,206 B2
(45) Date of Patent: Jun. 18, 2024

(54) DISPLAY PANEL AND DISPLAY APPARATUS

(71) Applicant: KunShan Go-Visionox Opto-Electronics Co., Ltd, Jiangsu (CN)

(72) Inventors: Junhui Lou, Kunshan (CN); Yong Wu, Kunshan (CN); Shixing Cai, Kunshan (CN); Yanan Ji, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 359 days.

(21) Appl. No.: 17/688,226

(22) Filed: Mar. 7, 2022

(65) Prior Publication Data

US 2022/0190051 A1 Jun. 16, 2022

Related U.S. Application Data

(63) Continuation of application No. PCT/CN2021/081743, filed on Mar. 19, 2021.

(30) Foreign Application Priority Data

Apr. 17, 2020 (CN) .......................... 202010305602.3

(51) Int. Cl.
*H10K 59/121* (2023.01)
*H01L 25/18* (2023.01)
*H10K 59/122* (2023.01)

(52) U.S. Cl.
CPC ............ *H10K 59/121* (2023.02); *H01L 25/18* (2013.01); *H10K 59/122* (2023.02)

(58) Field of Classification Search
CPC ..... H10K 59/12; H10K 59/121; H10K 59/131
See application file for complete search history.

(56) References Cited

U.S. PATENT DOCUMENTS

| | | | |
|---|---|---|---|
| 2020/0312832 A1 | 10/2020 | Chi et al. | |
| 2021/0013277 A1* | 1/2021 | Liu | H10K 59/122 |
| 2022/0093682 A1* | 3/2022 | Chang | H10K 59/00 |

FOREIGN PATENT DOCUMENTS

| | | |
|---|---|---|
| CN | 108269840 A | 7/2018 |
| CN | 209070895 U | 7/2019 |

(Continued)

OTHER PUBLICATIONS

International Search Report (with English Translation) and Written Opinion mailed on Jun. 18, 2021, in corresponding International Application No. PCT/CN2021/081743, 11 pages.

(Continued)

*Primary Examiner* — Douglas M Menz
(74) *Attorney, Agent, or Firm* — Maier & Maier, PLLC (57) ABSTRACT

A display panel and a display apparatus. The display panel includes a first display region, a second display region, and a third display region. A light transmittance of the first display region is greater than that of the third display region. The display panel includes: a plurality of first sub-pixels distributed in the first display region; a plurality of second sub-pixel groups distributed in the second display region, a second sub-pixel group includes a plurality of second sub-pixels; a plurality of third sub-pixels distributed in the third display region, a distribution density of the plurality of third sub-pixels is greater than a distribution density of the plurality of first sub-pixels; a total area of orthographic projections of the plurality of second sub-pixels in the second sub-pixel group is equal to an area of an orthographic projection of a single first sub-pixel.

19 Claims, 5 Drawing Sheets

(56) References Cited

FOREIGN PATENT DOCUMENTS

| | | |
|---|---|---|
| CN | 110783384 A | 2/2020 |
| CN | 110783385 A | 2/2020 |
| CN | 110838505 A | 2/2020 |
| CN | 110867476 A | 3/2020 |
| CN | 111430436 A | 7/2020 |
| WO | 2019242510 A1 | 12/2019 |

OTHER PUBLICATIONS

Notice of Allowance issued on Sep. 7, 2022, in connection with corresponding Chinese Application No. 202010305602.3; 8 pages.

* cited by examiner

DISPLAY PANEL AND DISPLAY APPARATUS

CROSS-REFERENCE TO RELATED APPLICATION

This application is a continuation of International Application No. PCT/CN2021/081743, filed on Mar. 19, 2021, which claims priority to Chinese Patent Application No. 202010305602.3 entitled "DISPLAY PANEL AND DISPLAY APPARATUS" and filed on Apr. 17, 2020, both of which are hereby incorporated by reference in their entireties.

TECHNICAL FIELD

The present application relates to a technical field of display, and in particular to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as mobile phones and tablets can integrate front cameras, telephone receivers and infrared sensing components by notching or trepanning on the display panel. External lights can pass through the notch or trepanning on the screen to enter into the photosensitive components located under the screen. Nevertheless, these electronic devices are not full screen devices in the true sense, and not all regions of the entire screen can display. For example, the region corresponding to the front camera cannot display pictures.

SUMMARY

The present application provides a display panel and a display apparatus, which enable at least a partial region of the display panel to be light transmittable and displayable, and facilitate the under-screen integration of photosensitive components.

The embodiments of a first aspect of the present application provide a display panel including a first display region, a second display region, and a third display region, wherein the second display region is located between the first display region and the third display region, a light transmittance of the first display region is greater than a light transmittance of the third display region, and the display panel includes: a plurality of first sub-pixels distributed in the first display region; a plurality of second sub-pixel groups distributed in the second display region, wherein the second sub-pixel group includes a plurality of second sub-pixels; a plurality of third sub-pixels distributed in the third display region, wherein a distribution density of the plurality of third sub-pixels is greater than a distribution density of the plurality of first sub-pixels, wherein a total area of orthographic projections of the plurality of second sub-pixels of the second sub-pixel group in a thickness direction of the display panel is equal to an area of an orthographic projection of a single first sub-pixel in the thickness direction of the display panel, the single first sub-pixel emits a same color with the plurality of second sub-pixels of the second sub-pixel group.

The embodiments of a second aspect of the present application provide a display apparatus including the display panel according to any of the above embodiments.

According to the display panel of the embodiments of the present application, the light transmittance of the first display region is greater than the light transmittance of the third display region. Therefore, the display panel can integrate photosensitive components on the back of the first display region, so as to realize the under-screen integration of the photosensitive components such as cameras. At the same time, the first display region can display pictures, which increases the display area of the display panel and realizes the full-screen design of the display apparatus.

According to the display panel of the embodiments of the present application, the distribution density of the third sub-pixels is greater than the distribution density of the first sub-pixels. Therefore, the distribution density of the first sub-pixels in the first display region is relatively low, and the area occupied by the first sub-pixels is relatively low. Thus, the light transmittance of the first display region is relatively high, which facilitates the under-screen integration of the photosensitive components. Meanwhile, the display boundary between the first display region and the third display region is relatively obvious.

In the embodiments of the present application, the second display region is provided between the first display region and the third display region. Further, the area of orthographic projections of the plurality of second sub-pixels in the second sub-pixel group in the second display region is the same as that of the first sub-pixel. Therefore, the brightness of the second display region is the same as the brightness of the first display region. At the same time, the distribution density of the second sub-pixels in the second display region is relatively high, that is, the distribution of the plurality of second sub-pixels in the second display region is more dispersed. Thus, the brightness distribution in the second display region is more uniform and is closer to the brightness distribution of the third display region. Therefore, the second display region located between the first display region and the third display region can play a role of transitional display, and can weaken the display boundary between the first display region and the third display region, thereby improving the display effect.

BRIEF DESCRIPTION OF THE DRAWINGS

Other features, objects, and advantages of the present application will become more apparent from the following detailed description of non-limiting embodiments with reference to the accompanying drawings, in which like or similar reference characters refer to the same or similar features, and the drawings are not necessarily drawn to scale.

DETAILED DESCRIPTION

Features and exemplary embodiments of various aspects of the present application are described in detail below. In order to make the purpose, technical solutions, and advantages of the present application more clear, the present application will be described in detail with reference to the accompanying drawings and specific embodiments. It should be understood that the specific embodiments described herein are only intended to explain the present application, and are not intended to limit the present application. For those skilled in the art, the present application can be implemented without some of these specific details. The following description of the embodiments is merely intended to provide a better understanding of the application by illustrating examples of the present application.

In electronic devices such as mobile phones and tablets, photosensitive components (e.g., front cameras, infrared light sensors, and proximity light sensors) are required to be integrated on the side where display panels are provided. In some embodiments, light-transmitting display regions may be provided on the above-described electronic devices, and the photosensitive components may be arranged on the back of the light-transmitting display regions, so that full-screen displaying by the electronic devices can be realized with the normal operation of the photosensitive components being ensured.

In order to improve the light transmittance of the light-transmitting display region and facilitate the arrangement of the pixel drive circuits for the sub-pixels in the light-transmitting display region, it is often necessary to reduce the pixels per inch (PPI) of the light-transmitting display region or even a partial display region around the light-transmitting display region. Therefore, the PPI thereof is lower than the PPI of the main display region of the display panel. At this time, when the display panel is displaying, it will often form a clear display boundary between the display region with higher PPI and the display region with lower PPI, which will affect the display effect.

In order to solve the above problems, the embodiments of the present application provide a display panel and a display apparatus. Hereinafter, various embodiments of the display panel and the display apparatus will be described with reference to the accompanying drawings.

The embodiments of the present application provide a display panel, which may be an organic light emitting diode (OLED) display panel.

Figure 1:
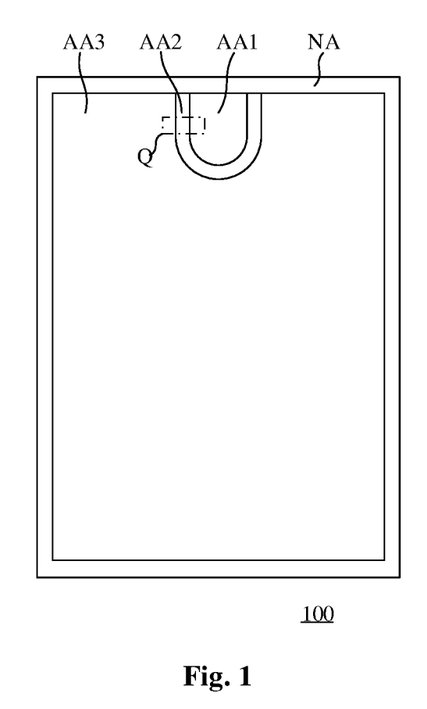
FIG. 1 is a top view of a display panel according to an embodiment of the present application.
Figure 2:
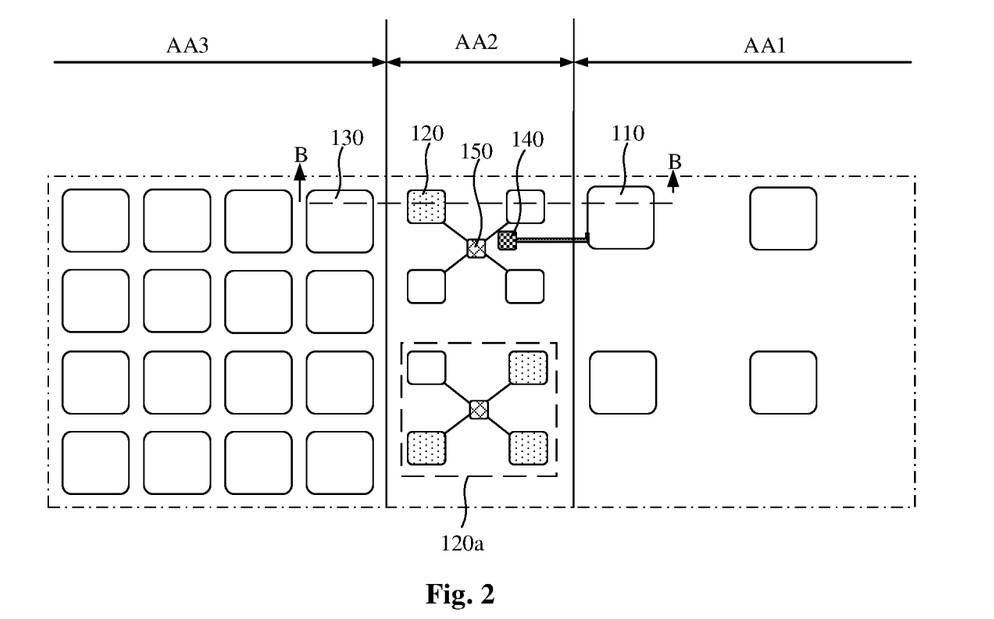
FIG. 2 is a partial enlarged view of a region Q1 in FIG. 1 according to an example.

FIG. 1 is a top view of a display panel according to an embodiment of the present application. FIG. 2 is a partial enlarged view of a region Q1 in FIG. 1 according to an example.

The display panel 100 includes a first display region AA1, a second display region AA2, a third display region AA3, and a non-display region NA surrounding the first display region AA1, the second display region AA2, and the third display region AA3. The second display region AA2 is located between the first display region AA1 and the third display region AA3, and a light transmittance of the first display region AA1 is greater than a light transmittance of the third display region AA3.

In the present application, preferably, the light transmittance of the first display region AA1 may be 15% or more. In order to ensure that the light transmittance of the first display region AA1 is greater than 15%, greater than 40%, or even higher, the light transmittance of at least some of the functional film layers of the display panel 100 in this embodiment is greater than 80%, and the light transmittance of at least some of the functional film layers is even greater than 90%.

According to the display panel 100 of the embodiments of the present application, the light transmittance of the first display region AA1 is greater than the light transmittance of the second display region AA2. Therefore, the display panel 100 can integrate photosensitive components on the back of the first display region AA1, so as to realize the under-screen integration of the photosensitive components such as cameras. At the same time, the first display region AA1 can display pictures, which increases the display area of the display panel 100 and realizes the full-screen design of the display apparatus.

Please continue to refer to FIG. 2. Optionally, the display panel 100 further includes a plurality of first sub-pixels 110 located in the first display region AA1, a plurality of second sub-pixels 120 located in the second display region AA2, and a plurality of third sub-pixels 130 located in the third display region AA3.

In some embodiments, the display panel 100 further includes a plurality of first pixel circuits 140. The first pixel circuits 140 are located in the second display region AA2, and are electrically connected to the first sub-pixels 110 for driving the first sub-pixels 110 to display. In FIG. 2, the position of one of the first pixel circuits 140 is exemplarily shown, which is electrically connected to a corresponding first sub-pixel 110. Nevertheless, there may be a plurality of first pixel circuits 140, and each first pixel circuit 140 may be electrically connected to a corresponding first sub-pixel 110.

According to the display panel 100 of the embodiments of the present application, the first pixel circuits 140 for driving the first sub-pixels 110 to display are located in the second display region AA2, thereby reducing the wiring structures in the first display region AA1, and increasing the light transmittance of the first display region AA1.

In some embodiments, the circuit structure of the first pixel circuit 140 is any one of a 2T1C circuit, a 7T1C circuit, a 7T2C circuit, or a 9T1C circuit. In the present application, "2T1C circuit" refers to a pixel circuit including two thin film transistors (T) and one capacitor (C) in the pixel circuit. Other "7T1C circuit", "7T2C circuit", "9T1C circuit" and so on can be deduced by analogy.

In some embodiments, the display panel 100 may further include a plurality of second pixel circuits 150. The second pixel circuits 150 are located in the second display region AA2, and are electrically connected to the second sub-pixels 120 for driving the second sub-pixels 120 to display. In some optional embodiments, a plurality of second sub-pixels 120 in a same second sub-pixel group 120a are driven by a same second pixel circuit 150.

In these optional embodiments, the first sub-pixel 110 is driven by the first pixel circuit 140, and the plurality of second sub-pixels 120 in the second sub-pixel group 120a are driven by the same second pixel circuit 150. Therefore, the driving current value of the second sub-pixel group 120a is close to the driving current value of the first sub-pixel 110. Thus, the brightness of the second sub-pixel group 120a is close to the brightness of the first sub-pixel 110, which can weaken the display boundary between the second display region AA2 and the first display region AA1.

Further, in some optional embodiments, the colors of the first sub-pixel 110 and the second sub-pixel group 120a are the same, and the first pixel circuit 140 and the second pixel circuit 150 are the same. The relationship between a driving voltage applied to a sub-pixel during display and a display brightness is called a gamma curve. The first pixel circuit 140 and the second pixel circuit 150 are the same, so that the gamma curve used by the first sub-pixel 110 is the same as the gamma curve used by the plurality of second sub-pixels 120 in the second sub-pixel group 120a. Therefore, applying the same driving voltage to the first sub-pixel 110 and the second sub-pixel group 120a can enable the first sub-pixel 110 and the second sub-pixel group 120a to display the same brightness, thereby weakening the display boundary between the second display region AA2 and the first display region AA1.

In some optional embodiments, the display panel 100 may further include a plurality of third pixel circuits (not shown in the figure). The third pixel circuits are located in the third display region AA3, and are electrically connected to the third sub-pixels 130 for driving the third sub-pixels 130 to display. In some optional embodiments, the circuit structure of the second pixel circuit 150 and the circuit structure of the third pixel circuit may be any of a 2T1C circuit, a 7T1C circuit, a 7T2C circuit, or a 9T1C circuit, respectively.

Figure 3:
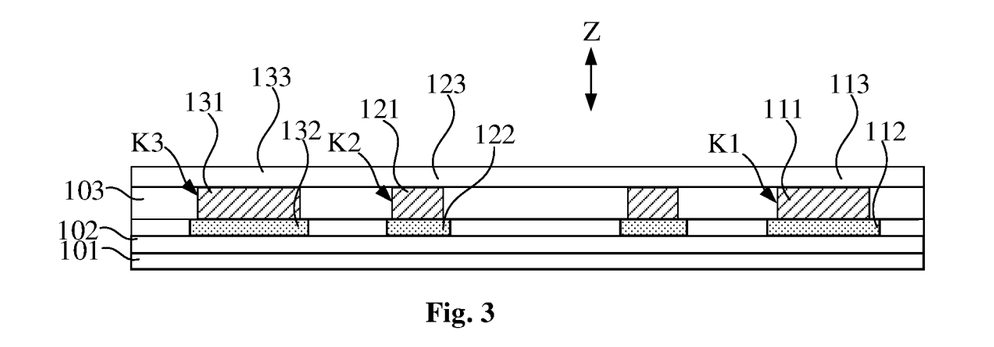
FIG. 3 is a cross-sectional view along a B-B direction in FIG. 2.

Please refer to FIG. 3, which is a cross-sectional view along a B-B direction in FIG. 2.

In some optional embodiments, the display panel 100 includes a substrate 101 and a pixel definition layer 103. The pixel definition layer 103 is located on the substrate 101.

The substrate 101 may be made of light-transmitting materials such as glass and polyimide (PI).

The pixel definition layer 103 includes a plurality of first pixel openings K1 located in the first display region AA1, a plurality of second pixel openings K2 located in the second display region AA2, and a plurality of third pixel openings K3 located in the third display region AA3.

In some optional embodiments, the display panel 100 further includes a device layer 102 located on the substrate 101 and located under the pixel definition layer 103. The first pixel circuits 140, the second pixel circuits 150 and the third pixel circuits are located on the device layer 102.

In some optional embodiments, each of the first sub-pixels 110 includes a first light-emitting structure 111, a first electrode 112 and a second electrode 113. The first light-emitting structure 111 is located in the first pixel opening K1, the first electrode 112 is located on a side of the first light-emitting structure 111 facing to the substrate 101, and the second electrode 113 is located on a side of the first light-emitting structure 111 away from the substrate 101. One of the first electrode 112 and the second electrode 113 is an anode, and the other is a cathode.

In some embodiments, each of the second sub-pixels 120 includes a second light-emitting structure 121, a third electrode 122 and a fourth electrode 123. The second light-emitting structure 121 is located in the second pixel opening K2, the third electrode 122 is located on a side of the second light-emitting structure 121 facing to the substrate 101, and the fourth electrode 123 is located on a side of the second light-emitting structure 121 away from the substrate 101. One of the third electrode 122 and the fourth electrode 123 is an anode, and the other is a cathode.

In some embodiments, each of the third sub-pixels 130 includes a third light-emitting structure 131, a fifth electrode 132 and a sixth electrode 133. The third light-emitting structure 131 is located in the third pixel opening K3, the fifth electrode 132 is located on a side of the third light-emitting structure 131 facing to the substrate 101, and the sixth electrode 133 is located on a side of the third light-emitting structure 131 away from the substrate 101. One of the fifth electrode 132 and the sixth electrode 133 is an anode, and the other is a cathode.

In this embodiment, the first electrode 112, the third electrode 122, and the fifth electrode 132 are anodes, and the second electrode 113, the fourth electrode 123, and the sixth electrode 133 are cathodes.

Figure 4:
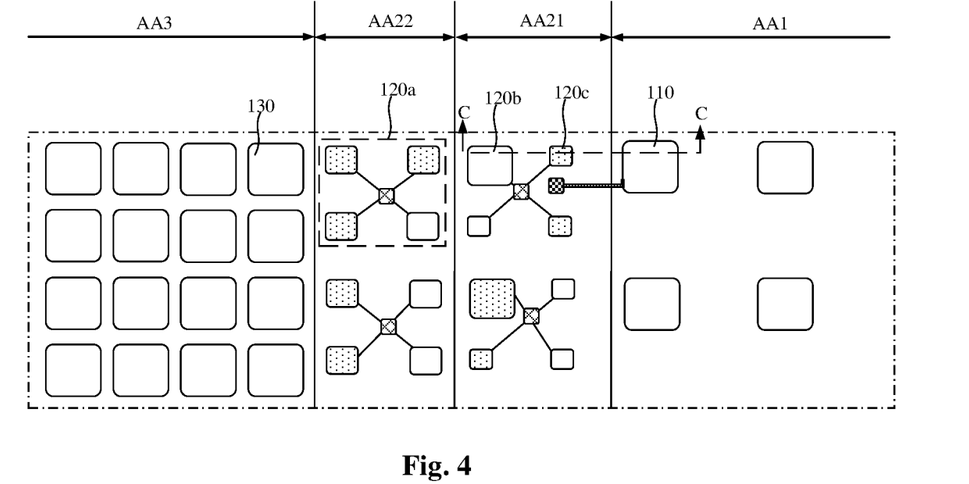
FIG. 4 is a partial enlarged view of a region Q1 in FIG. 1 according to another example, in which the adjacent regions include a first adjacent region AA21 and a second adjacent region AA22.
Figure 5:
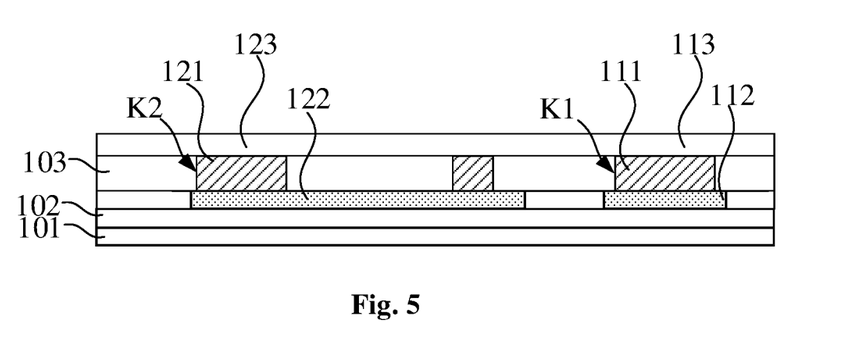
FIG. 5 is a cross-sectional view along a C-C direction in FIG. 4.

Please refer to FIGS. 4 and 5 together. FIG. 4 is an enlarged schematic view of a region Q1 in FIG. 1 according to another embodiment. FIG. 5 is a cross-sectional view along a C-C direction in FIG. 4.

In some optional embodiments, the display panel 100 includes a plurality of first sub-pixels 110 distributed in the first display region AA1; a plurality of second sub-pixel groups 120a distributed in the second display region AA2, wherein the second sub-pixel group 120a includes a plurality of second sub-pixels 120; a plurality of third sub-pixels 130 distributed in the third display region AA3, wherein a distribution density of the plurality of third sub-pixels 130 is greater than a distribution density of the plurality of first sub-pixels 110. Here, a total area of orthographic projections of the plurality of second sub-pixels 120 of the second sub-pixel group 120a in a thickness direction of the display panel 100 is equal to an area of an orthographic projection of a single first sub-pixel 110 in the thickness direction of the display panel 100, the single first sub-pixel 110 emits a same color with the plurality of second sub-pixels 120 in the second sub-pixel group 120a.

According to the display panel 100 of the embodiments of the present application, the distribution density of the third sub-pixels 130 is greater than the distribution density of the first sub-pixels 110. Therefore, the distribution density of the first sub-pixels 110 in the first display region AA1 is relatively low, and the area occupied by the first sub-pixels 110 is relatively low. Thus, the light transmittance of the first display region AA1 is relatively high, which facilitates the under-screen integration of the photosensitive components. Meanwhile, the display boundary between the first display region AA1 and the third display region AA3 is relatively obvious.

In the embodiments of the present application, the second display region AA2 is provided between the first display region AA1 and the third display region AA3. Further, the area of orthographic projections of the plurality of second sub-pixels 120 in the second sub-pixel group 120a in the second display region AA2 is the same as that of the first sub-pixel 110. Therefore, the brightness of the second display region AA2 is the same as the brightness of the first display region AA1. At the same time, the distribution density of the second sub-pixels 120 in the second display region AA2 is relatively high, that is, the distribution of the plurality of second sub-pixels 120 in the second display region AA2 is more dispersed. Thus, the brightness distribution in the second display region AA2 is more uniform and is closer to the brightness distribution of the third display region AA3. Therefore, the second display region AA2 located between the first display region AA1 and the third display region AA3 can play a role of transitional display, and can weaken the display boundary between the first display region AA1 and the third display region AA3, thereby improving the display effect.

The first sub-pixels 110 may be red sub-pixels, green sub-pixels, blue sub-pixels, or pixels of other colors. The plurality of second sub-pixels 120 in the second sub-pixel group 120a are sub-pixels of a same color, and the plurality of second sub-pixels 120 in the second sub-pixel group 120a may be red sub-pixels, green sub-pixels, blue sub-pixels, or pixels of other colors. The third sub-pixels 130 may be red sub-pixels, green sub-pixels, blue sub-pixels, or pixels of other colors.

A total area of orthographic projections of the plurality of second sub-pixels 120 in the second sub-pixel group 120a in a thickness direction of the display panel 100 is equal to an area of an orthographic projection of a single first sub-pixel 110 in the thickness direction of the display panel 100, and the single first sub-pixel 110 emits a same color with the plurality of second sub-pixels 120 in the second sub-pixel group 120 mean that the total area of orthographic projections of the plurality of second sub-pixels 120 of a same color in the thickness direction of the display panel 100 is equal to an area of an orthographic projection of a single first sub-pixel 110 in the thickness direction of the display panel 100, and the single first sub-pixel 110 emits the same color with the plurality of second sub-pixels 120 in the second sub-pixel group 120. For example, the total area of orthographic projections of the plurality of red second sub-pixels 120 in the second sub-pixel group 120a in the thickness direction of the display panel 100 is equal to the area of the orthographic projection of a single red first sub-pixel 110 in the thickness direction of the display panel 100.

In some embodiments, the first sub-pixels 110, the second sub-pixels 120, and the third sub-pixels 130 are sub-pixels of the same color. For example, the first sub-pixels 110, the second sub-pixels 120, and the third sub-pixels 130 are all red sub-pixels. The ratio relationship of the size of the sub-pixels and the spacing between the sub-pixels shown in FIG. 4 do not constitute a limitation to the embodiments of the present application. In FIG. 4, in order to better illustrate the positional relationship between the sub-pixels, the spacing between two adjacent sub-pixels is set to be small.

In some optional embodiments, a second pixel arrangement structure formed by the plurality of second sub-pixels 120 is the same as a third pixel arrangement structure formed by the plurality of third sub-pixels 130. The second pixel arrangement structure refers to the arrangement rule of the plurality of second sub-pixels 120 in the second display region AA2, that is, the arrangement pattern of the plurality of second sub-pixels 120 in the second display region AA2. Similarly, the third pixel arrangement structure refers to the arrangement rule of the plurality of third sub-pixels 130 in the third display region AA3, that is, the arrangement pattern of the plurality of third sub-pixels 130 in the third display region AA3.

In these optional embodiments, the second pixel arrangement structure is the same as the third pixel arrangement structure, so that the brightness distribution in the second display region AA2 is consistent with the brightness distribution in the third display region AA3, which can weaken the display boundary between the second display region AA2 and the third display region AA3.

In some optional embodiments, an area of an orthographic projection of the first sub-pixel 110 in the thickness direction (the Z direction in FIG. 3) of the display panel 100 (hereinafter referred to as the area of the orthographic projection of the first sub-pixel 110) is equal to an area of an orthographic projection of the third sub-pixel 130 in the thickness direction (hereinafter referred to as the area of the orthographic projection of the third sub-pixel 130) of the display panel 100. In these optional embodiments, the area of the orthographic projection of the first sub-pixel 110 and the area of the orthographic projection of the third sub-pixel 130 are the same. That is, the total area of orthographic projections of the plurality of second sub-pixels 120 of the second sub-pixel group 120a in the thickness direction of the display panel 100 is equal to the area of the orthographic projection of the third sub-pixel 130. Therefore, the display brightness of the second display region AA2 and the display brightness of the third display region AA3 are the same, which can weaken the display boundary between the second display region AA2 and the third display region AA3.

In other optional embodiments, a second sub-pixel group arrangement structure formed by the plurality of second sub-pixel groups 120a is the same as a first pixel arrangement structure formed by the plurality of first sub-pixels 110. The second sub-pixel group arrangement structure refers to the arrangement rule of the plurality of second sub-pixel groups 120a in the second display region AA2, that is, the arrangement pattern of the plurality of second sub-pixel groups 120a in the second display region AA2. Similarly, the first pixel arrangement structure refers to the arrangement rule of the plurality of first sub-pixels 110 in the first display region AA1, that is, the arrangement pattern of the plurality of first sub-pixels 110 in the first display region AA1.

In these optional embodiments, the total area of orthographic projections of the plurality of second sub-pixels 120 in the second sub-pixel group 120a is equal to the area of the orthographic projection of the first sub-pixel 110. That is, the display brightness of the second sub-pixel group 120a is equal to the display brightness of the first sub-pixel 110, and the arrangement structure of the second sub-pixel groups 120a is the same as the first pixel arrangement structure. Therefore, the brightness distribution in the second display region AA2 is consistent with the brightness distribution in the first display region AA1, which can weaken the display boundary between the second display region AA2 and the first display region AA1.

In some optional embodiments, in a unit area, the number of the second sub-pixels 120 is equal to the number of the third sub-pixels 130. Therefore, the display brightness of the second display region AA2 is closer to the display brightness of the third display region AA3, which can weaken the display boundary between the second display region AA2 and the third display region AA3.

In other optional embodiments, in a unit area, the number of the second sub-pixel groups 120a is equal to the number of the first sub-pixels 110. Therefore, the display brightness of the second display region AA2 is the same as the display brightness of the first display region AA1, which can weaken the display boundary between the second display region AA2 and the first display region AA1.

In some optional embodiments, the second display region AA2 includes a plurality of adjacent regions sequentially distributed along a direction from the first display region AA1 to the second display region AA2. The plurality of adjacent regions include a first adjacent region AA21 and a second adjacent region AA22. The second adjacent region AA22 is arranged adjacent to the third display region AA3, and the first adjacent region AA21 is located at a side of the second adjacent region AA22 facing to the first display region AA1. As shown in FIG. 4, there may be two adjacent regions, that is, the adjacent regions include the first adjacent region AA21 and the second adjacent region AA22.

Figure 6:
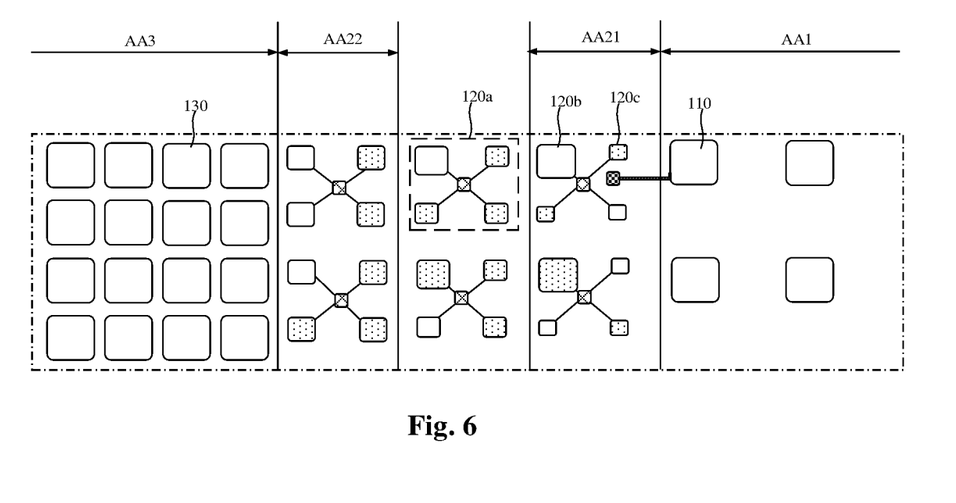
FIG. 6 is a partial enlarged view of a region Q1 in FIG. 1 according to another example, in which there are three adjacent regions, and there is another adjacent region disposed between the first adjacent region AA21 and the second adjacent region AA22.

Alternatively, please refer to FIG. 6, which is an enlarged schematic view of a region Q1 in FIG. 1 according to another embodiment.

As shown in FIG. 6, there are three adjacent regions, and there is another adjacent region disposed between the first adjacent region AA21 and the second adjacent region AA22. Alternatively, in other embodiments, another adjacent region is arranged on a side of the first adjacency region AA21 away from the second adjacency region AA22. There may also be four or more adjacent regions.

The plurality of second sub-pixels 120 of the second sub-pixel group 120a include at least one main sub-pixel 120b and at least one secondary sub-pixel 120c. In some optional embodiments, an area of an orthographic projection in the thickness direction of the main sub-pixel 120b in the first adjacent region AA21 (hereinafter referred to as the area of the orthographic projection of the main sub-pixel 120b) is greater than an area of an orthographic projection in the thickness direction of the main sub-pixel 120b in the second adjacent region AA22. That is, in a direction from the third display region AA3 to the first display region AA1, the area of the orthographic projection of the main sub-pixel 120b in different adjacent regions gradually increases. Therefore, the area of the orthographic projection of the main sub-pixel 120b gradually approaches the area of the orthographic projection of the first sub-pixel 110, and the arrangement of the plurality of second sub-pixels 120 in the second sub-pixel group 120a is closer to the arrangement of the first sub-pixels 110, which can further weaken the display boundary between the second display region AA2 and the first display region AA1. On the contrary, in a direction from the first display region AA1 to the third display region AA3, the area of the orthographic projection of the main sub-pixel 120b in different adjacent regions gradually decreases. Therefore, the area of the orthographic projection of the main sub-pixel 120b is closer to the area of the orthographic projection of the third sub-pixel 130, which can further weaken the display boundary between the second display region AA2 and the third display region AA3.

In other optional embodiments, an area of an orthographic projection in the thickness direction of a secondary sub-pixel 120c in the adjacent region close to the third sub-pixels 130 (hereinafter referred to as the area of the orthographic projection of the secondary sub-pixel 120c) is greater than an area of an orthographic projection in the thickness direction of a secondary sub-pixel 120c in the adjacent region close to the first sub-pixels 110. That is, in the direction from the third display region AA3 to the first display region AA1, the area of the orthographic projection of the secondary sub-pixel 120c in different adjacent regions gradually decreases. Therefore, the area of the orthographic projection of the main sub-pixel 120b in the second sub-pixel group 120a gradually increases, and the area of the orthographic projection of the main sub-pixel 120b in the second sub-pixel group 120a gradually approaches the area of the orthographic projection of the first sub-pixel 110. Thus, the brightness distribution of the plurality of second sub-pixels 120 in the second sub-pixel group 120a gradually approaches the brightness distribution of the first sub-pixel 110, which can further weaken the display boundary between the second display region AA2 and the first display region AA1.

In some optional embodiments, the second sub-pixel group 120a includes one main sub-pixel 120b. Therefore, the arrangement rule of the main sub-pixels 120b is similar to the arrangement rule of the first sub-pixels 110, which can weaken the display boundary between the second display region AA2 and the first display region AA1.

Further, in some optional embodiments, a main pixel arrangement structure formed by a plurality of main sub-pixels 120b is the same as the first pixel arrangement structure formed by the plurality of first sub-pixels 110. That is, the arrangement rule of the plurality of main sub-pixels 120b is similar to the arrangement rule of the plurality of first sub-pixels 110, which can further weaken the display boundary between the second display region AA2 and the first display region AA1.

In some optional embodiments, the second sub-pixel group 120a includes two or more secondary sub-pixels 120c, and areas of orthographic projections of the two or more secondary sub-pixels 120c in the thickness direction of the display panel 100 are the same. Therefore, the display brightness of the plurality of second sub-pixels 120 in the second sub-pixel group 120a is more uniform.

In some optional embodiments, the number of the third sub-pixels 130 distributed in a unit area is n times of the number of the first sub-pixels 110 distributed in the unit area, and the number of the second sub-pixels 120 in the second sub-pixel group 120a is n. Therefore, when the number of the first sub-pixels 110 is the same as the number of the second sub-pixel groups 120a, the number of the second sub-pixels 120 is the same as the number of the third sub-pixels 130, which can further weaken the display boundary between the second display region AA2 and the third display region AA3.

As shown in FIGS. 2, 4, and 6, the number of the third sub-pixels 130 distributed in a unit area is four times of the number of the first sub-pixels 110 distributed in the unit area, and the number of the second sub-pixels 120 in the second sub-pixel group 120a is four.

Further, in some optional embodiments, in the second adjacent region AA22, an area of an orthographic projection of the main sub-pixel 120b in the thickness direction of the display panel 100 is equal to an area of an orthographic projection of the secondary sub-pixel 120c in the thickness direction of the display panel 100. Therefore, the brightness distribution of the main sub-pixels 120b and the secondary sub-pixels 120c in the second sub-pixel group 120a is more uniform, and is closer to the brightness distribution of the plurality of third sub-pixels 130 in the third display region AA3, which can further weaken the display boundary between the second display region AA2 and the third display region AA3.

In some optional embodiments, the number of the adjacent regions is m, and m is a positive integer. When the first adjacent region AA21 is adjacent to the first display region AA1, an area of an orthographic projection in the thickness direction of the secondary sub-pixel 120c in the first adjacent region AA21 is 1/mn of an area of an orthographic projection of the first sub-pixel 110 in the thickness direction of the display panel 100. That is, an area of an orthographic projection of a main sub-pixel 120b in the first adjacent region AA21 is 1−(n−1)/mn of the area of the orthographic projection of the first sub-pixel 110. Therefore, the area of the orthographic projection of the main sub-pixel 120b is closer to the area of the orthographic projection of the first sub-pixel 110, which can weaken the display boundary between the first display region AA1 and the second display region AA2.

As shown in FIG. 4, m is 2, and n is 4. The first adjacent region AA21 is adjacent to the first display region AA1, and the area of the orthographic projection of the secondary sub-pixel 120c in the first adjacent region AA21 is ⅛ of the area of the orthographic projection of the first sub-pixel 110. The area of the orthographic projection of the main sub-pixel 120b in the first adjacent region AA21 is 1−(4−1)/8 of the area of the orthographic projection of the first sub-pixel 110. That is, the area of the orthographic projection of the main sub-pixel 120b in the first adjacent region AA21 is ⅝ of the area of the orthographic projection of the first sub-pixel 110.

As shown in FIG. 6, m is 3, and n is 4. The first adjacent region AA21 is adjacent to the first display region AA1, and the area of the orthographic projection of the secondary sub-pixel 120c in the first adjacent region AA21 is 1/12 of the area of the orthographic projection of the first sub-pixel 110. The area of the orthographic projection of the main sub-pixel 120b in the first adjacent region AA21 is 1−(4−1)/12 of the area of the orthographic projection of the first sub-pixel 110. That is, the area of the orthographic projection of the main sub-pixel 120b in the first adjacent region AA21 is ¾ of the area of the orthographic projection of the first sub-pixel 110.

In other optional embodiments, a difference between two areas of two orthographic projections of two secondary sub-pixels 120c in the thickness direction of the display panel 100 is 1/mn of an area of an orthographic projection of the first sub-pixel 110 in the thickness direction, wherein the two secondary sub-pixels 120c are respectively located in two adjacent regions which are adjacent to each other. Therefore, in the direction from the third display region AA3 to the first display region AA1, the area of the orthographic projection of the secondary sub-pixel 120c can be gradually reduced by a step of 1/mn of the area of the orthographic projection of the first sub-pixel 110. Thus, the area of the orthographic projection of the main sub-pixel 120b can be gradually increased, which can enable the brightness transition in the second display region AA2 to be more uniform, and can further weaken the display boundary between the first display region AA1 and the third display region AA3.

As shown in FIG. 4, m is 2, n is 4. The first adjacent region AA21 is adjacent to the second adjacent region AA22. The area of the orthographic projection of the secondary sub-pixel 120c in the first adjacent region AA21 is ⅛ of the area of the orthographic projection of the first sub-pixel 110. The area of the orthographic projection of the secondary sub-pixel 120c in the second adjacent region AA22 is ¼ of the area of the orthographic projection of the first sub-pixel 110. Therefore, the difference between areas of orthographic projections of two secondary sub-pixels 120c respectively located in two adjacent regions adjacent to each other is ⅛ of the area of the orthographic projection of the first sub-pixel 110.

As shown in FIG. 6, m is 3, n is 4. The first adjacent region AA21 is adjacent to the first display region AA1. The area of the orthographic projection of the secondary sub-pixel 120c in the first adjacent region AA21 is 1/12 of the area of the orthographic projection of the first sub-pixel 110. The area of the orthographic projection of the secondary sub-pixel 120c in the adjacent region between the first adjacent region AA21 and the second adjacent region AA22 is ⅙ of the area of the orthographic projection of the first sub-pixel 110. The area of the orthographic projection of the secondary sub-pixel 120c in the second adjacent region AA22 is ¼ of the area of the orthographic projection of the first sub-pixel 110. Therefore, the difference between areas of orthographic projections of two secondary sub-pixels 120c respectively located in two adjacent regions adjacent to each other is 1/12 of the area of the orthographic projection of the first sub-pixel 110.

In some embodiments, the third electrodes 122 of the plurality of second sub-pixels 120 in the second sub-pixel group 120a are connected, so that the second sub-pixel group 120a can be driven by a same second pixel circuit 150. There are many ways to connect the third electrodes 122 of the plurality of second sub-pixels 120 in the second sub-pixel group 120a. For example, the third electrodes 122 of the plurality of second sub-pixels 120 in the second sub-pixel group 120a are interconnected as a common electrode, or the third electrodes 122 of the plurality of second sub-pixels 120 in the second sub-pixel group 120a are connected to each other by wires.

The first light-emitting structure 111, the second light-emitting structure 121, and the third light-emitting structure 131 may each include an OLED light-emitting layer. According to the design requirements of the first light-emitting structure 111, the second light-emitting structure 121, and the third light-emitting structure 131, each of them may also include at least one of a hole injection layer, a hole transport layer, an electron injection layer, or an electron transport layer.

In some embodiments, the first electrode 112 is a light-transmitting electrode. In some embodiments, the first electrode 112 includes an indium tin oxide (ITO) layer or an indium zinc oxide layer. In some embodiments, the first electrode 112 is a reflective electrode, and the first electrode 112 includes a first light-transmitting conductive layer, a reflective layer on the first light-transmitting conductive layer, and a second light-transmitting conductive layer on the reflective layer. The first light-transmitting conductive layer and the second light-transmitting conductive layer may be an ITO layer, an indium zinc oxide layer and the like, and the reflective layer may be a metal layer, for example, made of silver materials. The third electrode 122 and the fifth electrode 132 may be configured to use the same materials as the first electrode 112 respectively.

In some embodiments, the second electrode 113 includes a magnesium-silver alloy layer. The fourth electrode 123 and the sixth electrode 133 may be configured to use the same materials as the second electrode 113 respectively. In some embodiments, the second electrode 113, the fourth electrode 123, and the sixth electrode 133 may be interconnected as a common electrode.

In some embodiments, an orthographic projection of each first light-emitting structure 111 on the substrate 101 includes a first graphic unit or at least two first graphic units spliced together, and the first graphic unit includes at least one selected from a group consisting of a circle shape, an ellipse shape, a dumbbell shape, a gourd shape, and a rectangle shape.

In some embodiments, an orthographic projection of each first electrode 112 on the substrate 101 includes a second graphic unit or at least two second graphic units spliced together, and the second graphic unit includes at least one selected from a group consisting of a circle shape, an ellipse shape, a dumbbell shape, a gourd shape, and a rectangle shape.

In some embodiments, an orthographic projection of each second light-emitting structure 121 on the substrate 101 includes a third graphic unit or at least two third graphic units spliced together, and the third graphic unit includes at least one selected from a group consisting of a circle shape, an ellipse shape, a dumbbell shape, a gourd shape, and a rectangle shape.

In some embodiments, an orthographic projection of each third electrode 122 on the substrate 101 includes a fourth graphic unit or at least two fourth graphic units spliced together, and the fourth graphic unit includes at least one selected from a group consisting of a circle shape, an ellipse shape, a dumbbell shape, a gourd shape, and a rectangle shape.

Exemplarily, the display panel 100 may further include an encapsulation layer, and a polarizer and a cover plate located over the encapsulation layer. Alternatively, the cover plate may be directly disposed over the encapsulation layer, and no polarizer is required. Alternatively, at least in the first display region AA1, the cover plate is directly disposed over the encapsulation layer, and no polarizer is required, thereby preventing the polarizer from affecting the light collection amount of the photosensitive components disposed under the first display region AA1. Of course, the polarizer can also be disposed over the encapsulation layer in the first display region AA1.

The embodiments of the present application also provide a display apparatus, which may include the display panel 100 of any one of the above embodiments. A display apparatus of an embodiment will be described below as an example, and in this embodiment, the display apparatus includes the display panel 100 of the above embodiments.

Figure 7:
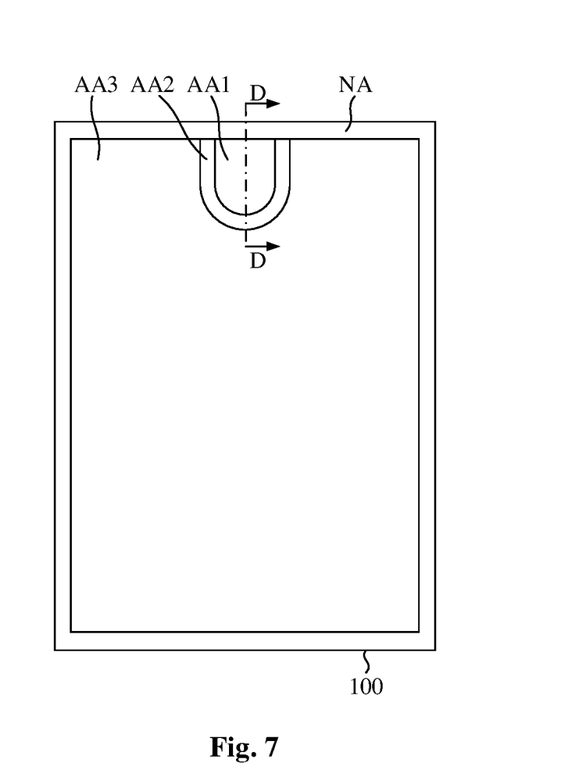
FIG. 7 is a top view of a display apparatus according to an embodiment of the present application.
Figure 8:
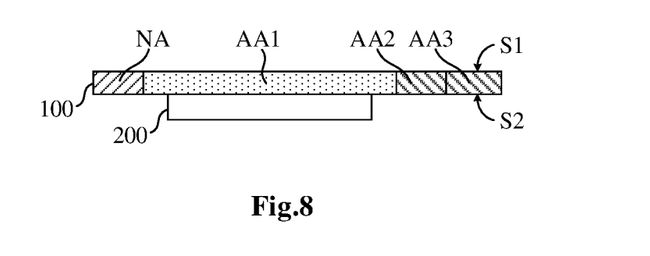
FIG. 8 is a cross-sectional view along a D-D direction in FIG. 7.

FIG. 7 is a top view of a display apparatus according to an embodiment of the present application, and FIG. 8 is a cross-sectional view along a D-D direction in FIG. 7. In the display apparatus of this embodiment, the display panel may be the display panel of any one of the above embodiments. The display panel includes the first display region and the second display region, and the light transmittance of the first display region is greater than the light transmittance of the second display region.

The display panel 100 includes a first surface S1 and a second surface S2 disposed oppositely, and the first surface S1 is a surface for display. The display apparatus further includes a photosensitive component 200 positioned on a side of the display panel 100 where the second surface S2 is disposed. The photosensitive component corresponds to the position of the first display region AA1.

The photosensitive component 200 may be an image capture apparatus for capturing external image information. In this embodiment, the photosensitive component 200 may be a complementary metal oxide semiconductor (CMOS) image capture apparatus. In some other embodiments, the photosensitive component 200 may be a charge-coupled device (CCD) image capture device or other form of image capture device. The photosensitive component 200 may not be limited to an image capture device. For example, in some embodiments, the photosensitive component 200 may be a light sensor such as an infrared sensor, a proximity sensor, an infrared lens, a flood sensing element, an ambient light sensor, and a dot matrix projector. In addition, in the display apparatus, other components may further be integrated on a side of the display panel 100 where the second surface S2 is disposed, such as an earpiece, a speaker, etc.

According to the display apparatus in the embodiments of the present application, the light transmittance of the first display region AA1 is greater than the light transmittance of the third display region AA3. Therefore, a photosensitive component 200 can be integrated on the back side of the first display region AA1 of the display panel 100 to realize under-screen integration of a photosensitive component such as an image acquisition device. At the same time, the first display region AA1 is able to display pictures, thereby increasing the display area of the display panel 100 and realizing a full-screen design of the display apparatus. In the embodiments of the present application, the second display region AA2 is provided between the first display region AA1 and the third display region AA3. Therefore, the second display region AA2 located between the first display region AA1 and the third display region AA3 can play a role of transitional display, and can weaken the display boundary between the first display region AA1 and the third display region AA3, thereby improving the display effect.

Those skilled in the art should understand that the above-mentioned embodiments are all exemplary rather than restrictive. Different technical features presented in different embodiments may be combined to achieve advantageous effects. Those skilled in the art should be able to understand and implement other modified embodiments of the disclosed embodiments on the basis of studying the drawings, the description, and the claims.

What is claimed is:

1. A display panel comprising a first display region, a second display region, and a third display region, wherein the second display region is located between the first display region and the third display region, a light transmittance of the first display region is greater than a light transmittance of the third display region, and the display panel comprises:
   a plurality of first sub-pixels distributed in the first display region;
   a plurality of second sub-pixel groups distributed in the second display region, wherein the second sub-pixel group comprises a plurality of second sub-pixels;
   a plurality of third sub-pixels distributed in the third display region, wherein a distribution density of the plurality of third sub-pixels is greater than a distribution density of the plurality of first sub-pixels,
   wherein a total area of orthographic projections of the plurality of second sub-pixels of the second sub-pixel group in a thickness direction of the display panel is equal to an area of an orthographic projection of a single first sub-pixel in the thickness direction of the display panel, the single first sub-pixel emits a same color with the plurality of second sub-pixels of the second sub-pixel group.

2. The display panel according to claim 1, wherein
   a second pixel arrangement structure formed by the plurality of second sub-pixels is the same as a third pixel arrangement structure formed by the plurality of third sub-pixels; and/or
   a second sub-pixel group arrangement structure formed by the plurality of second sub-pixel groups is the same as a first pixel arrangement structure formed by the plurality of first sub-pixels.

3. The display panel according to claim 1, wherein an area of an orthographic projection of the single first sub-pixel in the thickness direction of the display panel is equal to an area of an orthographic projection of a single third sub-pixel in the thickness direction of the display panel.

4. The display panel according to claim 1, wherein
   in a unit area, the number of the second sub-pixels is equal to the number of the third sub-pixels; and/or,
   in a unit area, the number of the second sub-pixel groups is equal to the number of the first sub-pixels.

5. The display panel according to claim 1, wherein the second display region comprises a plurality of adjacent regions sequentially distributed along a direction from the first display region to the second display region, the plurality of adjacent regions comprise a first adjacent region and a second adjacent region, the second adjacent region is arranged adjacent to the third display region, and the first adjacent region is located at a side of the second adjacent region facing to the first display region;

the plurality of second sub-pixels of the second sub-pixel group comprise at least one main sub-pixel and at least one secondary sub-pixel, and an area of an orthographic projection in the thickness direction of a secondary sub-pixel in the adjacent region close to the third sub-pixels is greater than an area of an orthographic projection in the thickness direction of a secondary sub-pixel in the adjacent region close to the first sub-pixels.

6. The display panel according to claim 5, wherein an area of an orthographic projection in the thickness direction of the main sub-pixel in the first adjacent region is greater than an area of an orthographic projection in the thickness direction of the main sub-pixel in the second adjacent region.

7. The display panel according to claim 5, wherein the second sub-pixel group comprises one main sub-pixel.

8. The display panel according to claim 7, wherein a main pixel arrangement structure formed by a plurality of main sub-pixels is the same as a first pixel arrangement structure formed by the plurality of first sub-pixels.

9. The display panel according to claim 7, wherein the second sub-pixel group comprises two or more secondary sub-pixels, and areas of orthographic projections of the two or more secondary sub-pixels in the thickness direction of the display panel are the same.

10. The display panel according to claim 5, wherein the number of the third sub-pixels distributed in a unit area is n times of the number of the first sub-pixels distributed in the unit area, and the number of the second sub-pixels in the second sub-pixel group is n.

11. The display panel according to claim 10, wherein in the second adjacent region, an area of an orthographic projection of the main sub-pixel in the thickness direction of the display panel is equal to an area of an orthographic projection of the secondary sub-pixel in the thickness direction of the display panel.

12. The display panel according to claim 10, wherein the number of the adjacent regions is m, and m is a positive integer;
the first adjacent region is adjacent to the first display region, and an area of an orthographic projection in the thickness direction of the secondary sub-pixel in the first adjacent region is 1/mn of an area of an orthographic projection of the first sub-pixel in the thickness direction; and/or
a difference between two areas of two orthographic projections of two secondary sub-pixels in the thickness direction of the display panel is 1/mn of an area of an orthographic projection of the first sub-pixel in the thickness direction of the display panel, wherein the two secondary sub-pixels are respectively located in two adjacent regions which are adjacent to each other.

13. The display panel according to claim 1, wherein the display panel comprises:
a substrate;
a pixel definition layer located on the substrate, wherein the pixel definition layer comprises a plurality of first pixel openings in the first display region and a plurality of second pixel openings in the second display region,
each of the first sub-pixels comprises a first light-emitting structure located in the first pixel opening, a first electrode located on a side of the first light-emitting structure facing to the substrate, and a second electrode located on a side of the first light-emitting structure away from the substrate;
each of the second sub-pixels comprises a second light-emitting structure located in the second pixel opening, a third electrode located on a side of the second light-emitting structure facing to the substrate, and a fourth electrode located on a side of the second light-emitting structure away from the substrate.

14. The display panel according to claim 13, wherein third electrodes of the plurality of second sub-pixels in the second sub-pixel group are connected.

15. The display panel according to claim 13, wherein
an orthographic projection of each first light-emitting structure on the substrate comprises a first graphic unit or at least two first graphic units spliced together, and the first graphic unit comprises at least one selected from a group consisting of a circle shape, an ellipse shape, a dumbbell shape, a gourd shape, and a rectangle shape; and/or
an orthographic projection of each second light-emitting structure on the substrate comprises a third graphic unit or at least two third graphic units spliced together, and the third graphic unit comprises at least one selected from a group consisting of a circle shape, an ellipse shape, a dumbbell shape, a gourd shape, and a rectangle shape.

16. The display panel according to claim 13, wherein an orthographic projection of each first electrode on the substrate comprises a second graphic unit or at least two second graphic units spliced together, and the second graphic unit comprises at least one selected from a group consisting of a circle shape, an ellipse shape, a dumbbell shape, a gourd shape, and a rectangle shape; and/or
an orthographic projection of each third electrode on the substrate comprises a fourth graphic unit or at least two fourth graphic units spliced together, and the fourth graphic unit comprises at least one selected from a group consisting of a circle shape, an ellipse shape, a dumbbell shape, a gourd shape, and a rectangle shape.

17. The display panel according to claim 1, wherein the display panel further comprises a plurality of second pixel circuits for driving the second sub-pixels to display, and the plurality of second sub-pixels in a same second sub-pixel group are driven by a same second pixel circuit.

18. The display panel according to claim 17, wherein the display panel further comprises a plurality of first pixel circuits for driving the first sub-pixels to display, the first sub-pixels and the second sub-pixel groups have the same color, and the first pixel circuits and the second pixel circuits are the same.

19. A display apparatus comprising the display panel according to claim 1.

* * * * *